United States Patent
Sirito-Olivier

(10) Patent No.: US 7,190,218 B2
(45) Date of Patent: Mar. 13, 2007

(54) DIFFERENTIAL OR SINGLE-ENDED AMPLIFIER AND RELATIVE CONTROL METHOD

(75) Inventor: Philippe Sirito-Olivier, Carro par Martigues (FR)

(73) Assignees: STMicroelectronics S.r.l., Agrate Brianza (IT); STMicroelectronics SA, Montrouge (FR)

( * ) Notice: Subject to any disclaimer, the term of this patent is extended or adjusted under 35 U.S.C. 154(b) by 0 days.

(21) Appl. No.: 11/055,925

(22) Filed: Feb. 11, 2005

(65) Prior Publication Data

US 2005/0174172 A1 Aug. 11, 2005

(30) Foreign Application Priority Data

Feb. 11, 2004 (IT) .......................... VA2004A0006

(51) Int. Cl.
*H03F 1/24* (2006.01)

(52) U.S. Cl. ...................... 330/98; 330/296; 330/291

(58) Field of Classification Search .................. 330/98, 330/296, 291

See application file for complete search history.

(56) References Cited

U.S. PATENT DOCUMENTS

| | | | | | |
|---|---|---|---|---|---|
| 4,042,886 | A | * | 8/1977 | Hanna | 330/256 |
| 5,675,245 | A | * | 10/1997 | Millar et al. | 324/95 |
| 6,509,722 | B2 | * | 1/2003 | Lopata | 323/280 |
| 6,617,928 | B2 | * | 9/2003 | Finlay et al. | 330/288 |
| 6,653,891 | B1 | * | 11/2003 | Hazucha | 327/540 |
| 6,714,081 | B1 | * | 3/2004 | Xu | 330/296 |
| 6,774,724 | B2 | * | 8/2004 | Krvavac | 330/296 |

* cited by examiner

*Primary Examiner*—Patricia Nguyen
(74) *Attorney, Agent, or Firm*—Lisa K. Jorgenson; Allen, Dyer, Doppelt, Milbrath & Gilchrist, P.A.

(57) ABSTRACT

The method controls, in a feedback mode, a common collector or common drain amplifier, biased with a voltage applied on a bias node produced by a biasing circuit that generates a temperature compensated reference voltage from which the bias voltage applied on the bias node of the amplifier is derived. The quiescent voltage on the output node of the amplifier is made substantially independent from temperature by sensing the quiescent voltage on the output node, and adjusting the voltage applied on the bias node of the amplifier based upon the difference between the reference voltage and the sensed quiescent voltage for maintaining it constant.

17 Claims, 5 Drawing Sheets

DIFFERENTIAL OR SINGLE-ENDED AMPLIFIER AND RELATIVE CONTROL METHOD

FIELD OF THE INVENTION

The present invention relates to electronic amplifiers, and, more in particular, to a method of controlling a common collector or common drain amplifier and to a related common collector or common drain differential or single-ended amplifier with reduced sensitivity to temperature variations.

BACKGROUND OF THE INVENTION

In the design of integrated circuits it is often necessary to control the quiescent voltage of output signals of a stage, for instance for nullifying it in coincidence with a null input signal. The term "quiescent voltage" of an output signal of a stage indicates the voltage present at the output when the input signal is null. It may represent the DC component of a single-ended signal or the common mode voltage of a differential signal.

At times, it is necessary to insert a buffer stage between two circuits in cascade, for providing on a relatively low impedance node, the signal produced by the upstream circuit to the downstream circuit. In applications as the ones mentioned above, common collector amplifiers are often used, such as a single-ended amplifier depicted in FIG. 1.

A biasing network DC_POLARIZATION fixes the working point of the transistor, that generates an output voltage OUT corresponding to the input signal IN. The quiescent voltage at the output is determined by the polarization of the transistor Qa. When the quiescent voltage of a differential signal, that is its common mode voltage, must be modified, a differential stage as the one shown in FIG. 2 is generally used, which is obtained by connecting two amplifiers of FIG. 1 in parallel, using the same biasing network.

Only for illustration purposes, hereinafter reference will be made to amplifiers realized with bipolar NPN transistors, as shown in the figures, but the same architectures may be realized with PNP transistors or with MOS transistors, as would be appreciated by those skilled in the art. An important requisite of these amplifiers is to have an operation characteristic substantially independent from temperature. Should this not be the case, then the output quiescent voltage would drift and this could cause signal processing errors.

For this reason, the biasing network DC_POLARIZATION usually comprises a band-gap reference voltage generator that is relatively insensible to temperature variations. Therefore, the biasing voltage applied on the base node (or the gate node in MOS technology) is kept substantially constant. Unfortunately, even with this expedient, the quiescent output voltage may still vary with temperature, because the bias current I and the base-emitter (gate-source) voltage inevitably vary with the temperature of operation.

SUMMARY OF THE INVENTION

The above mentioned persisting problem is addressed by the present invention, that provides a method of controlling a common collector amplifier, indifferently single-ended or differential, and related architectures of a common collector single-ended and differential amplifiers that ensure a substantial independence from temperature of the DC component (in case of a single-ended output) or the common mode voltage (in case of a differential output) of the output signal.

By analyzing the operation of these amplifiers, it is evident that the quiescent voltage of the output signal is determined substantially by the DC component of the emitter (source) voltage, that depends on the biasing of the transistor. According to the control method of this invention, even if the base-emitter voltage varies with temperature, it is possible to keep constant the DC component of the emitter voltage by adjusting the base voltage. In practice, to make the quiescent voltage independent from temperature, the biasing voltage of the amplifier that is applied to the base (gate) node, is adjusted for compensating eventual variations of the quiescent voltage.

More precisely, this invention provides a method of controlling in a feedback mode a common collector or common drain amplifier, biased with a voltage applied on a bias node produced by a biasing circuit or means that generates a temperature compensated reference voltage from which the bias voltage applied on the bias node of the amplifier is derived.

The quiescent voltage on the output node of the amplifier is made substantially independent from temperature by: sensing the quiescent voltage on the output node; and adjusting the voltage applied on the bias node of the amplifier based upon the difference between the reference voltage and the sensed quiescent voltage for maintaining it constant.

A common collector amplifier of this invention has a feedback circuit comprising: a sensing circuit of the DC component (or the common mode voltage for a differential amplifier) present on the output node (or nodes in case of a differential output); and an operational amplifier of the difference between the temperature compensated reference voltage of the biasing circuit or means and the sensed DC component (or the common mode voltage), generating the bias voltage that is applied on the bias node of the amplifier.

BRIEF DESCRIPTION OF THE DRAWINGS

The various features and advantages of this invention will become even more evident through a detailed description referring to the attached drawings, wherein.

DETAILED DESCRIPTION OF THE PREFERRED EMBODIMENTS

Figure 1:
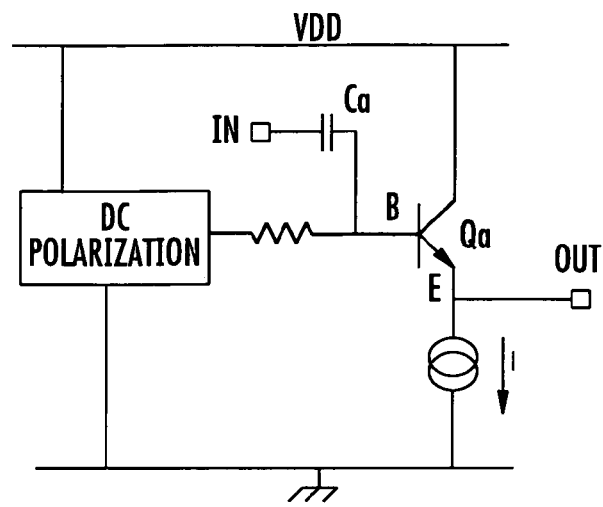
FIG. 1 is a schematic diagram showing a known single-ended common collector amplifier.
Figure 2:
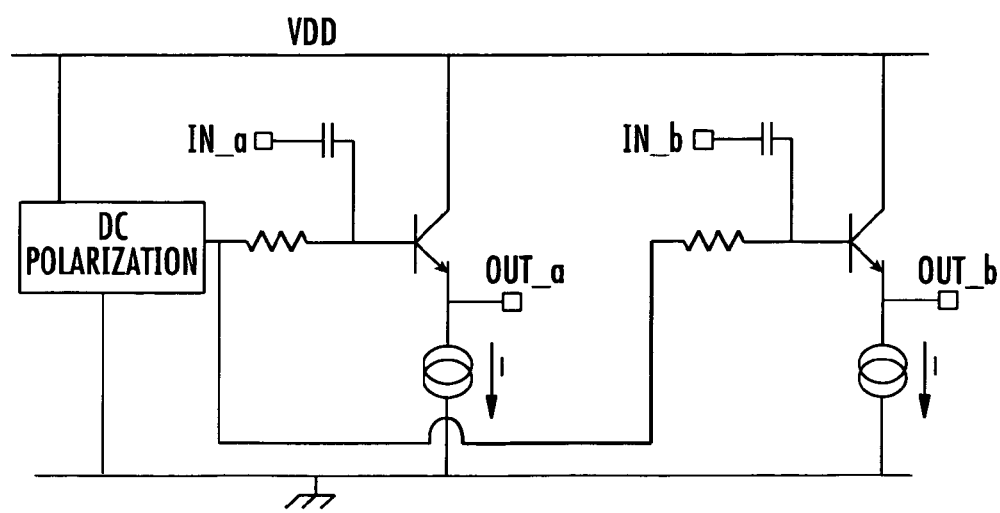
FIG. 2 is a schematic diagram showing a known common collector differential amplifier.
Figure 3:
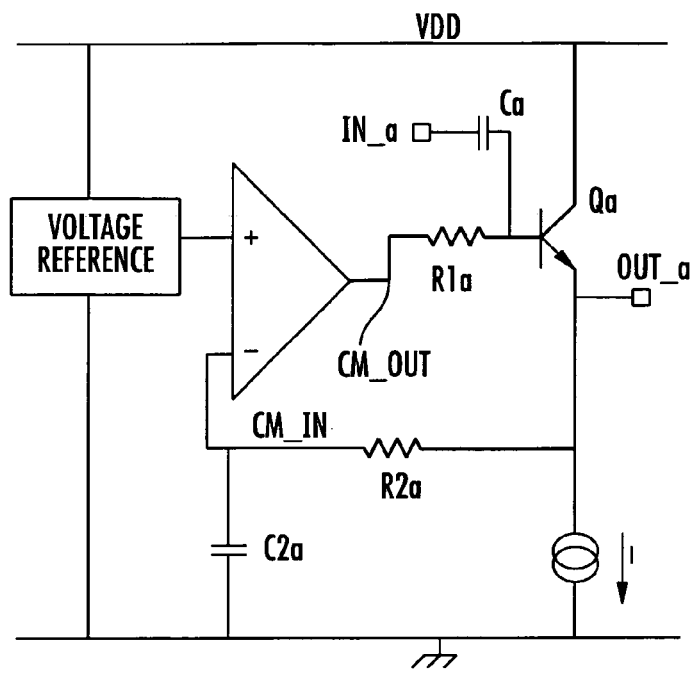
FIG. 3 is a schematic diagram showing a common collector single-ended amplifier of the present invention.

A single-ended common collector amplifier of this invention is depicted in FIG. 3. This architecture differs from that of the known amplifier of FIG. 1 because of the presence of a feedback line that senses the DC component CM_IN of the output signal, representing the quiescent output voltage, and that locks it via an operational amplifier. This amplifier produces the bias voltage CM_OUT, that is applied on the bias node of the common collector amplifier and locks the voltage CM_IN to a reference voltage independent from temperature, generated by a constant voltage generator, VOLTAGE_REFERENCE, that typically is a band-gap voltage generator.

When the base-emitter voltage (or the gate-source voltage in case of MOS transistors) diminishes because of an increase of the temperature of operation, the operational amplifier varies the bias voltage CM_OUT that is applied to the base of the output transistor and the DC component of the emitter (source) voltage, that corresponds to the quiescent voltage on the output node OUT_A, remains substantially constant. The voltage CM_IN is generated by a low-pass filter connected to the output node of the amplifier, that may be a R-C filter R2a-C2a such as represented in figure or any other low-pass filter.

Figure 4:
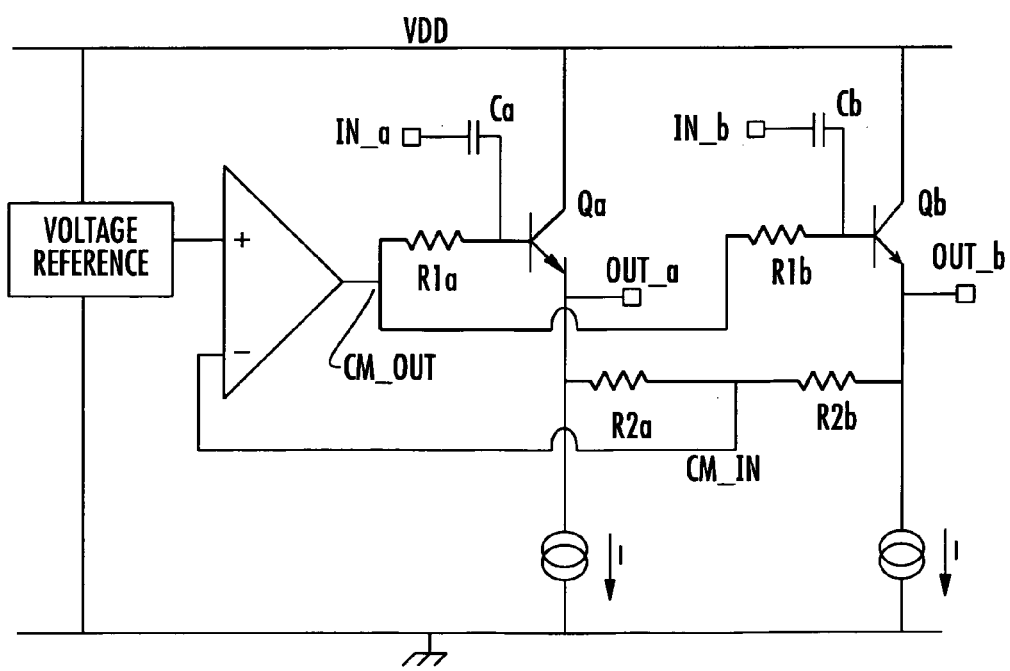
FIG. 4 is a schematic diagram showing a common collector differential amplifier of this invention.

FIG. 4 shows another common collector differential amplifier made according to this invention. In this case, the quiescent voltage CM_IN is the output common mode voltage of the amplifier. By connecting two identical resistors R2a and R2b in series between the output nodes of the amplifier, this voltage is present on the intermediate connection node between the two identical resistors.

Figure 5:
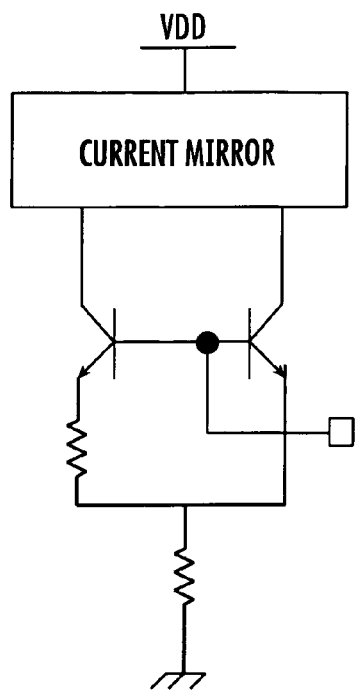
FIGS. 5 and 6 are schematic diagrams showing known architectures of generators of a temperature compensated reference voltage.
Figure 6:
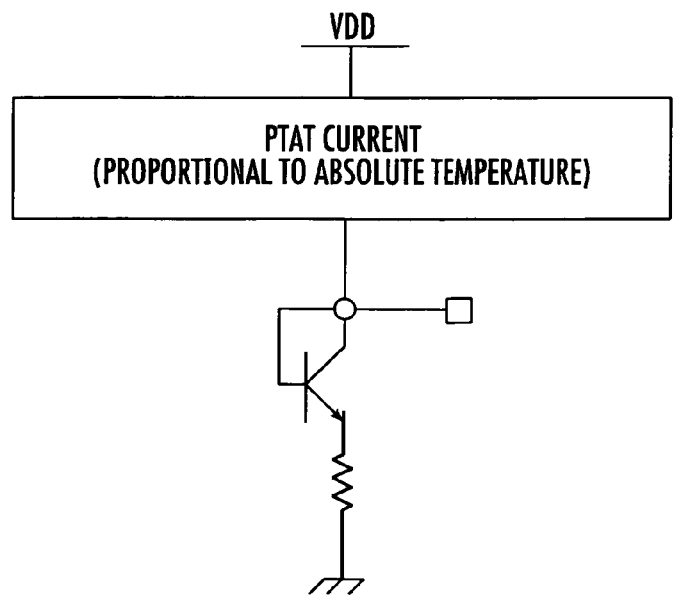

Common temperature compensated reference voltage generators, disclosed in Paul Brokaw "A Simple Three-Terminal IC Bandgap Voltage Reference" *IEEE Journal of Solid State Circuits*, Vol. SC-9, December 1974, are shown in FIGS. 5 and 6. The circuit PTAT_CURRENT (Proportional To Absolute Temperature) may be any common current generator proportional to the absolute temperature, for instance the generator described at pages 330–338 of the book "Analysis and Design of Analog Integrated Circuits" by P. R. Gray and R. G. Meyer, John Wiley & Sons, third edition, may be satisfactorily used.

Figure 7:
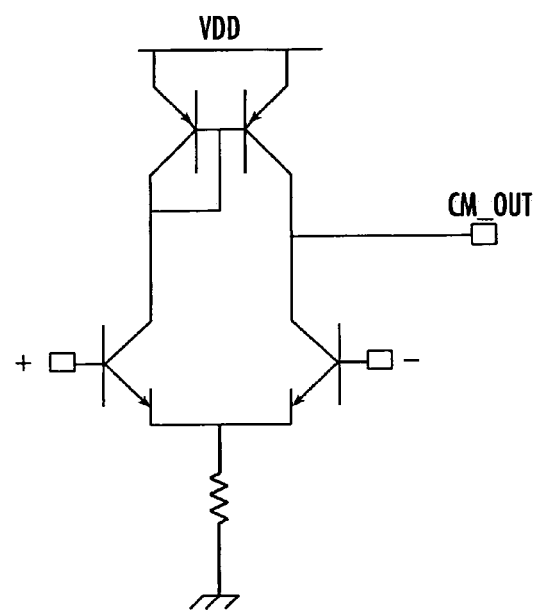
FIG. 7 is a schematic diagram showing an embodiment of the operational amplifier of FIGS. 3 and 4.
Figure 8:
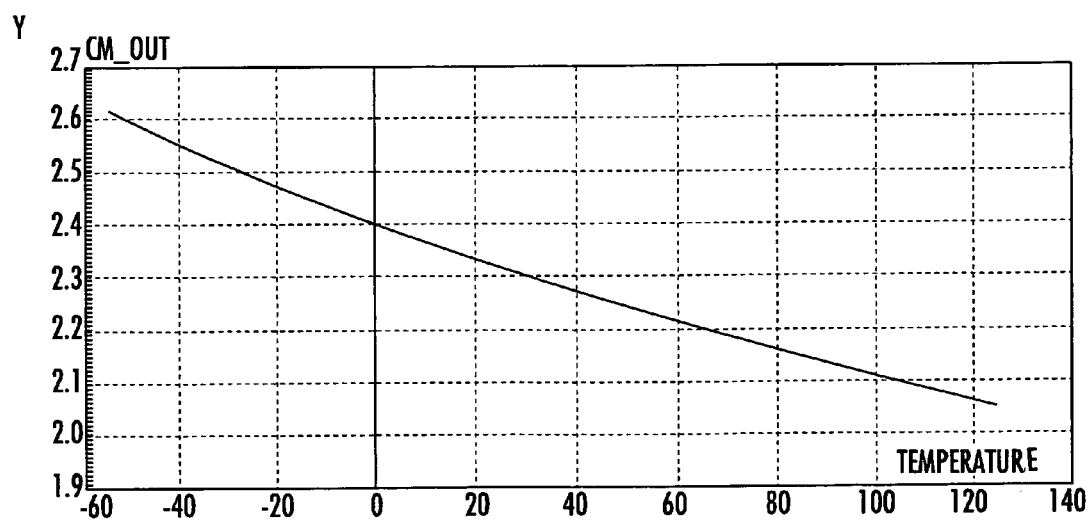
FIG. 8 is a graph of the voltage applied on the bias node of the amplifier of FIG. 4 based upon the temperature of operation.
Figure 9:
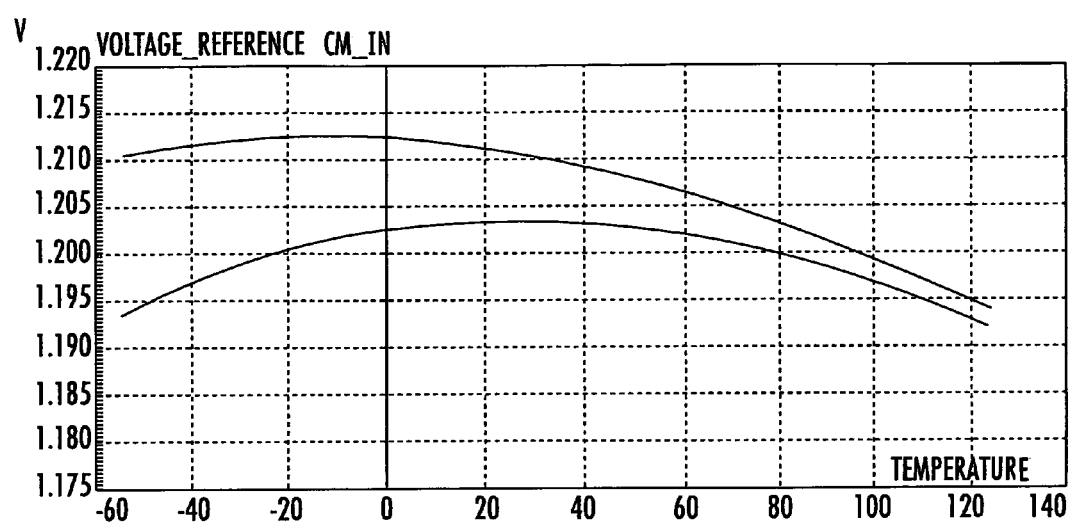
FIG. 9 is a graph of the reference voltage and the common mode voltage of the amplifier of FIG. 4 as a function of the temperature of operation.

The operational amplifier may be realized with a differential pair of transistors as shown in FIG. 7. The operation of the circuit of FIG. 4 has been simulated from −55° C. to 125° C. with a commercial software for analyzing electronic circuits. By choosing the following resistors and the following bias current:

$$R1a=R1b=R2a=R2b=5000\Omega; \qquad I=1.5mA;$$

the diagrams of FIGS. 8 and 9 have been obtained.

It is noted that in the differential amplifier of this invention the output common mode voltage CM_IN shows a maximum variation of 1% through the whole temperature range, demonstrating to be more stable than the reference voltage of the generator VOLTAGE_REFERENCE. This important result is due to the fact that the operational amplifier reduces relevantly the bias voltage CM_OUT when temperature increases, as shown in FIG. 8, such that the variations of the base-emitter voltage of the transistors with temperature do not cause any appreciable variation of the DC component of the emitter voltage.

That which is claimed is:

1. A method of controlling, in a feedback mode, a common-terminal amplifier biased with a bias voltage applied to a control node thereof and generating an output signal proportional to an input signal, with a quiescent voltage on an output node thereof; a biasing circuit including a voltage generator of a temperature independent reference voltage producing the bias voltage applied on the control node of the amplifier, the method comprising:

sensing the quiescent voltage of the amplifier; and
adjusting the bias voltage applied to the control node of the amplifier based upon a difference between the temperature independent reference voltage and the sensed quiescent voltage to maintain the quiescent voltage constant.

2. The method of claim 1, wherein the bias voltage applied to the control node of the amplifier is proportional to the difference between the reference voltage and the quiescent output voltage.

3. The method of claim 1, wherein the common-terminal amplifier comprises a common-collector amplifier.

4. The method of claim 1, wherein the common-terminal amplifier comprises a common-drain amplifier.

5. A method of controlling a common-terminal amplifier in a feedback mode comprising:

biasing a control node of the amplifier with a bias voltage generated with a temperature independent reference voltage;
generating an output signal, proportional to an input signal, with a quiescent voltage on an output node of the amplifier;
sensing the quiescent voltage of the amplifiers; and
adjusting the bias voltage applied to the control node of the amplifier based upon a difference between the temperature independent reference voltage and the sensed quiescent voltage to maintain the quiescent voltage constant.

6. The method of claim 5, wherein the bias voltage applied to the control node of the amplifier is proportional to the difference between the reference voltage and the quiescent output voltage.

7. The method of claim 5, wherein the common-terminal amplifier comprises a common-collector amplifier.

8. The method of claim 5, wherein the common-terminal amplifier comprises a common-drain amplifier.

9. A common-terminal amplifier circuit generating an output signal proportional to an input signal and with a DC component, comprising:

a common-terminal amplifier having a control node;
a biasing circuit including a voltage generator to generate a temperature independent reference voltage; and
a feedback circuit comprising
a sensing circuit for sensing the DC component of the output signal, and
an operational amplifier outputting a bias voltage applied to the control node of the common-terminal amplifier based upon a difference between the reference voltage and the sensed DC component of the output signal.

10. The common-terminal amplifier of claim 9, wherein said sensing circuit comprises a low-pass filter connected between an output and an input of the operational amplifier.

11. The common-terminal amplifier of claim 9, wherein said operational amplifier receives the reference voltage on a non-inverting input and the sensed DC component of the output signal on an inverting input.

12. The common-terminal amplifier of claim 9, wherein the common-terminal amplifier comprises a common-collector amplifier.

13. The common-terminal amplifier of claim 9, wherein the common-terminal amplifier comprises a common-drain amplifier.

14. A common-terminal differential amplifier circuit comprising:

a pair of common-terminal single-ended amplifiers each biased with a bias voltage applied on respective control nodes, and generating a differential output signal proportional to a differential input signal with a common mode output voltage;

a biasing circuit including a voltage generator to generate a temperature independent reference voltage for producing the bias voltage applied to the control nodes of the common-terminal amplifiers; and a feedback circuit comprising a sensing circuit connected to the outputs of the amplifiers to sense the common mode output voltage, and an operational amplifier outputting a bias voltage applied to the control nodes of the common-terminal amplifiers based upon a difference between the reference voltage and the sensed common mode output voltage.

15. The differential amplifier of claim 14, wherein said sensing circuit includes two substantially similar resistors connected in series between the outputs of the common-terminal amplifiers and having a connection node therebetween; and wherein the operational amplifier has an inverting input connected to the connection node between the resistors, and a non-inverting input receiving the temperature independent reference voltage.

16. The differential amplifier of claim 14, wherein the common-terminal amplifiers comprise common-collector amplifiers.

17. The differential amplifier of claim 14, wherein the common-terminal amplifiers comprise common-drain amplifiers.

* * * * *

UNITED STATES PATENT AND TRADEMARK OFFICE
CERTIFICATE OF CORRECTION

PATENT NO. : 7,190,218 B2  Page 1 of 1
APPLICATION NO. : 11/055925
DATED : March 13, 2007
INVENTOR(S) : Philippe Sirito-Olivier It is certified that error appears in the above-identified patent and that said Letters Patent is hereby corrected as shown below:

Column 1, Line 63    Delete: " a "

Column 3, Lines 18-19    Delete: "in figure"
Insert: -- in the figure --

Column 4, Line 23    Delete: "amplifiers"
Insert: -- amplifier --

Signed and Sealed this

Seventh Day of August, 2007

JON W. DUDAS
*Director of the United States Patent and Trademark Office*